(12) United States Patent
Park et al.

(10) Patent No.: US 7,332,948 B2
(45) Date of Patent: Feb. 19, 2008

(54) DUTY CYCLE CORRECTION CIRCUIT OF A DLL CIRCUIT

(75) Inventors: Sang Won Park, Chungcheongbuk-do (KR); Min Young You, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 48 days.

(21) Appl. No.: 11/320,832

(22) Filed: Dec. 30, 2005

(65) Prior Publication Data
US 2006/0267649 A1    Nov. 30, 2006

(30) Foreign Application Priority Data
May 30, 2005   (KR)   ............ 10-2005-0045628

(51) Int. Cl.
*H03K 3/017*   (2006.01)
(52) U.S. Cl. .................. 327/175; 327/160
(58) Field of Classification Search .......... 327/175
See application file for complete search history.

(56) References Cited

U.S. PATENT DOCUMENTS

| | | |
|---|---|---|
| 6,518,809 B1 | 2/2003 | Kotra |
| 7,071,746 B2 * | 7/2006 | Suda et al. ............ 327/158 |
| 2004/0213067 A1 | 10/2004 | Best et al. |
| 2005/0007168 A1 | 1/2005 | Park et al. |

FOREIGN PATENT DOCUMENTS

| | | |
|---|---|---|
| JP | 2002-124856 | 4/2002 |
| JP | 2005-020711 | 1/2005 |
| KR | 1020000009099 | 2/2000 |
| KR | 1020040095965 | 11/2004 |

* cited by examiner

*Primary Examiner*—Linh My Nguyen
*Assistant Examiner*—William Hernandez
(74) *Attorney, Agent, or Firm*—Lowe Hauptman Ham & Berner LLP

(57) ABSTRACT

The present invention relates to a duty cycle correction circuit of a DLL circuit. According to the present invention, in an Active Power-Down Mode (APDM), a voltage comparator of a duty cycle correction circuit operates without being reset. Therefore, although an internal power supply voltage is instantly changed in the APDM, the duty cycle of a DLL clock can be accurately set to 50%.

6 Claims, 3 Drawing Sheets

DUTY CYCLE CORRECTION CIRCUIT OF A DLL CIRCUIT

BACKGROUND

1. Field of the Invention

The present invention relates to a duty cycle correction circuit of a Delay Locked Loop (DLL) circuit and more particularly, to a duty cycle correction circuit of a DLL circuit in which the duty cycle of a DLL clock of a DLL circuit can be accurately set regardless of variation in an internal power supply voltage.

2. Discussion of Prior Art

In a Double Data Rate Synchronous Dynamic Random Access Memory (DDR SDRAM) device, data are input and output in synchronization with a rising edge and a falling edge of an external clock, respectively. Data that are output by the read operation of the DDR SDRAM must be accurately aligned with the edge of the external clock.

The DDR SDRAM delays a received external clock for a predetermined time and generates an internal clock. The input and output of data are synchronized with the internal clock. If the input and output of data are controlled in this manner, the data can be accurately aligned with the edge of the external clock.

At this time, a circuit that delays a received external clock for a predetermined time and generates an internal clock is referred to as a Delay Locked Loop (DLL) circuit.

To set the duty cycle of the DLL clock of the DLL circuit, a duty cycle correction circuit is used. The duty cycle correction circuit is not able to easily and accurately set the duty cycle of the DLL clock to 50% because of changes in PVT (Process, Voltage, Temperature). More particularly, if a DDR SDRAM device enters Active Power-Down Mode (APDM), a voltage comparator of the duty cycle correction circuit is reset and the operation of the duty cycle correction circuit is held, so that an analog output of a Digital/Analog (D/A) converter is not further updated.

FIG. 1 shows an operating timing diagram of a duty cycle correction circuit of a DLL circuit in the prior art.

As shown in FIG. 1, while in the APDM (from APDEN to APDEX), a voltage comparator (not shown) of the duty cycle correction circuit is reset according to a clock enable signal (CKE), so that the analog output signals (DCCFVREF, DCCRVREF) of a D/A converter (not shown) are not updated.

That is, if an internal power supply voltage is changed while in the APDM, the analog output signals (DCCFVREF, DCCRVREF) of the D/A converter are changed, as shown in FIG. 1. Therefore, the duty cycle of buffered clocks (FCKDCC, RCKDCC) output through a clock buffer/mux unit (not shown) does not become 50%. As a result, the duty cycle of the DLL clock does not become 50%.

If the APDM read operation is performed when the duty cycle of the DLL clock is deviated from 50%, tAC (DQ output access time from CK & /CK) or tCK (Clock cycle time) is changed due to the DLL clock whose duty cycle is deviated, resulting in a failed DRAM operation.

SUMMARY OF THE INVENTION

An advantage of the present invention is that it provides a duty cycle correction circuit of a DLL circuit, in which the duty cycle of a DLL clock can be accurately set although an internal power supply voltage is changed while in the APDM.

A duty cycle correction circuit of a DLL circuit according to an embodiment of the present invention includes a clock buffer/mux unit that buffers/multiplexes an external clock and outputs a buffered clock, a phase comparison/amplification unit that compares/amplifies the phase of the buffered clock and generates first and second phase difference signals, a voltage comparator that generates an increment signal and a decrement signal and that compares the first and second phase difference signals even while in an Active Power-Down Mode (APDM) and sets the duty cycle of the buffered clock to that of the external clock, a bi-directional counter that outputs a count signal for aligning the buffered clock with the duty cycle of the external clock in response to the increment signal or the decrement signal, and a digital/analog converter that outputs duty cycle correction analog signals for correcting the duty cycle of the buffered clock using the count signal.

DETAILED DESCRIPTION OF PREFERRED EMBODIMENTS

The present invention will now be described in connection with preferred embodiments with reference to the accompanying drawings.

Figure 1:
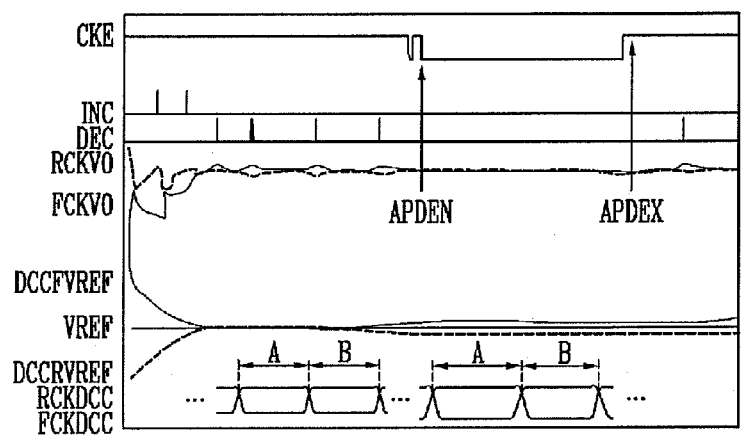
FIG. 1 shows an operating timing diagram of a duty cycle correction circuit of a DLL circuit in the related art.
Figure 2:
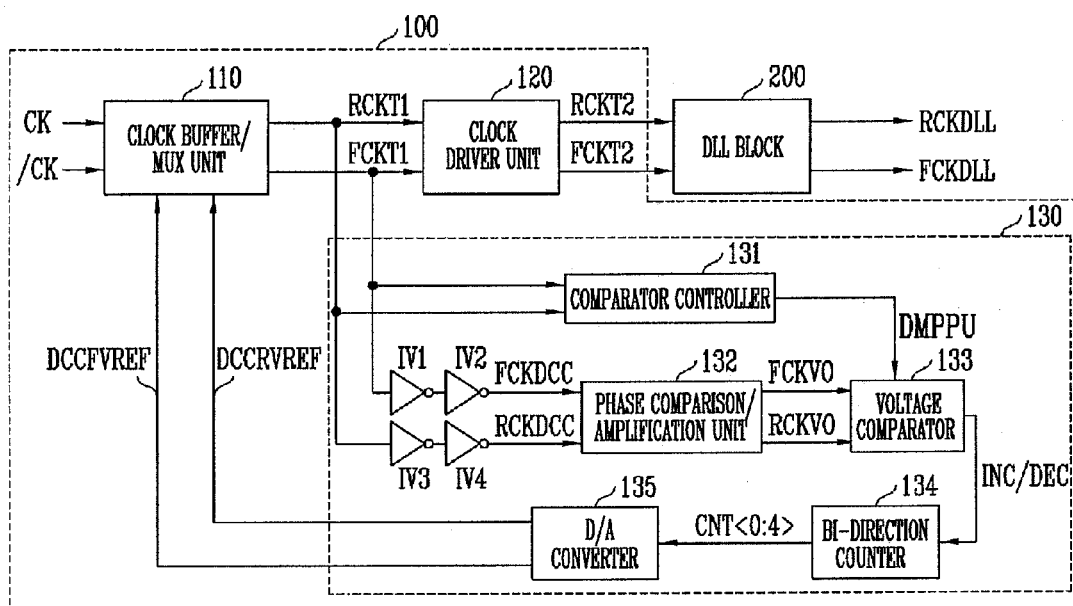
FIG. 2 is a circuit diagram of a duty cycle correction circuit of a DLL circuit according to an embodiment of the present invention.

FIG. 2 is a circuit diagram of a duty cycle correction circuit of a DLL circuit according to an embodiment of the present invention.

Referring to FIG. 2, the duty cycle correction circuit 100 includes a clock buffer/mux unit 110, a clock driver unit 120 and a duty cycle correction unit 130.

The clock buffer/mux unit 110 buffers and multiplexes external clocks (CK, /CK) that are externally input, and outputs buffered clocks (RCKT1, FCKT1) using duty cycle correction analog signals DCCFVREF and DCCRVREF.

The clock driver unit 120 receives the buffered clocks (RCKT1, FCKT1) from the clock buffer/mux unit 110 and outputs clocks (RCKT2, FCKT2) for driving a DLL block 200.

The duty cycle correction unit 130 includes inverter IV1 to IV4, a comparator controller 131, a phase comparison/amplification unit 132, a voltage comparator 133, a bi-directional counter 134 and a D/A converter 135.

The inverters IV1 and IV2 invert the buffered clocks (FCKT1) twice and output a buffered clock (FCKDCC). The inverters IV3 and IV4 invert the buffered clocks (RCKT1) twice and output a buffered clock (RCKDCC).

The phase comparison/amplification unit 132 compares and amplifies a phase difference of the buffered clocks (FCKDCC, RCKDCC) and generates phase difference signals FCKVO, RCKVO.

The comparator controller 131 receives the buffered clocks (RCKT1, FCKT1) and generates a driving signal (DMPPU) for driving the voltage comparator 133.

The voltage comparator 133 compares the phase difference signals (FCKVO, RCKVO) and generates an increment signal (INC) and a decrement signal (DEC) for correcting the duty cycle of the buffered clocks (FCKT1, RCKT1), in response to the driving signal (DMPPU) without being reset even while in the APDM (does not receive a clock enable (CKE)).

The bi-directional counter 134 generates a 5-bit count signal (CNT<0:4>) in response to the increment signal (INC) or the decrement signal (DEC).

The digital/analog converter 135 generates duty cycle correction analog signals (DCCFVREF, DCCRVREF) in response to the 5-bit count signal (CNT<0:4>) for correcting the duty cycle of the buffered clocks (RCKT1, FCKT1).

The clock buffer/mux unit 110 outputs the clocks (RCKT1, FCKT1) whose duty cycle is corrected to 50% using the duty cycle correction analog signals (DCCFVREF, DCCRVREF), which are generated by the duty cycle correction unit 130.

Figure 3:
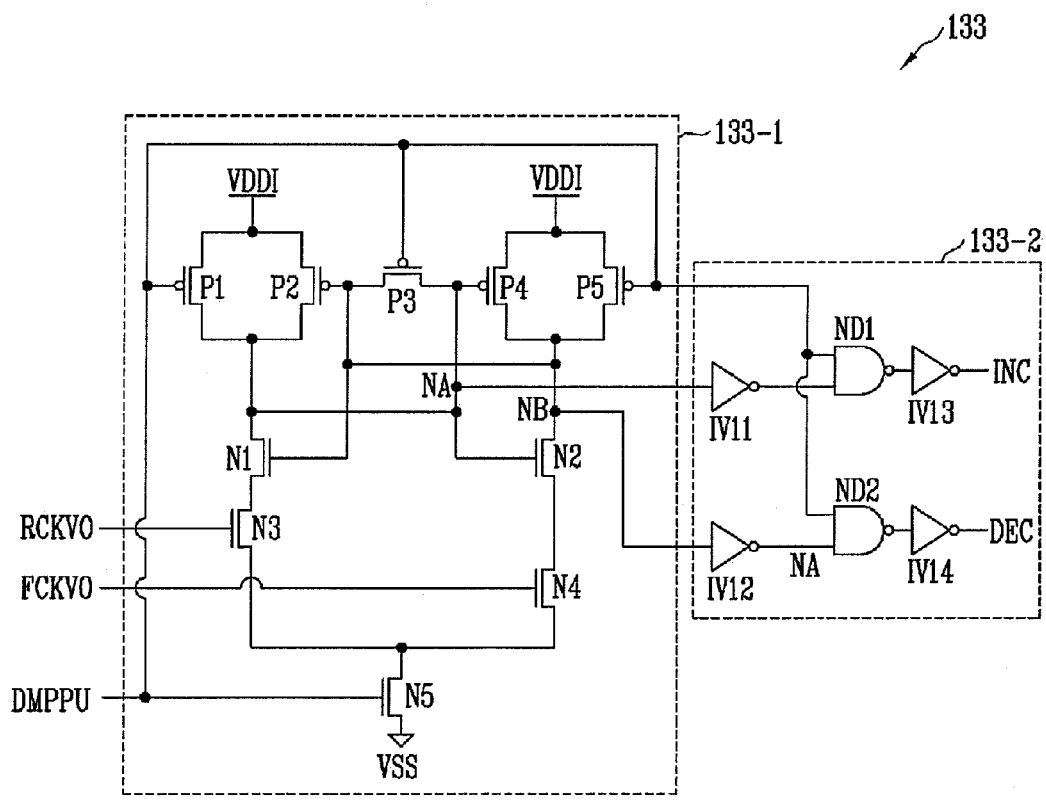
FIG. 3 is a detailed circuit diagram of a voltage comparator shown in FIG. 2.

FIG. 3 is a detailed circuit diagram of the voltage comparator 133 shown in FIG. 2. The voltage comparator 133 continues to operate without being reset even while in the APDM.

Referring to FIG. 3, the voltage comparator 133 includes a differential amplifier 133-1 and a digital signal generator 133-2.

If a driving signal (DMPPU) is logic high, the differential amplifier 133-1 compares/amplifies the phase difference signals (RCKVO, FCKVO) and outputs a signal of a node NA and a signal of a node NB to the digital signal generator 133-2. The digital signal generator 133-2 logically combines the signal of the node NA, the signal of the node NB and the driving signal (DMPPU), which are output from the differential amplifier 133-1, and outputs the increment signal (INC) and the decrement signal (DEC).

Figure 4A:
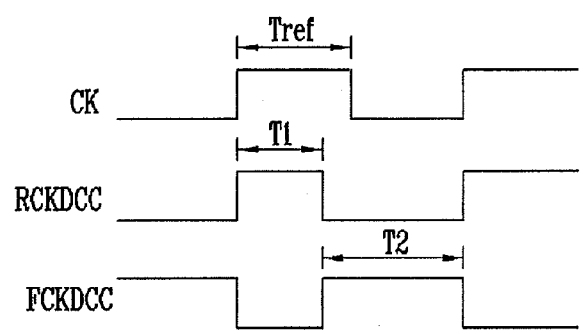
FIGS. 4a and 4b show waveforms of clocks in FIG. 2.
Figure 4B:
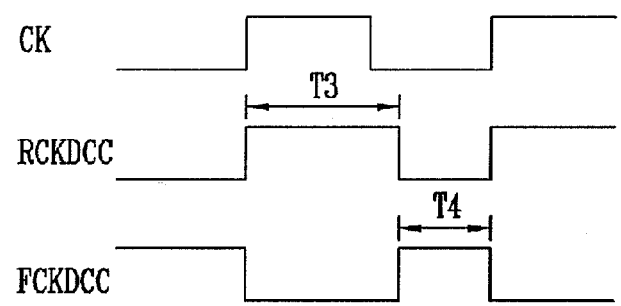

FIGS. 4a and 4b show waveforms of clocks in FIG. 2. If the clocks (RCKDCC, FCKDCC) having a waveform as shown in FIG. 4a are input to the phase comparison/amplification unit 132, the voltage level of the phase difference signal (RCKVO) becomes higher than that of the phase difference signal (FCKVO). The voltage comparator 133 outputs the increment signal (INC) as logic high and outputs the decrement signal (DEC) as logic low.

Meanwhile, if the clocks (RCKDCC, FCKDCC) having a waveform as shown in FIG. 4b are input to the phase comparison/amplification unit 132, the voltage level of the phase difference signal (FCKVO) becomes higher than that of the phase difference signal (RCKVO). The voltage comparator 133 outputs the increment signal (INC) as logic low and outputs the decrement signal (DEC) as logic high.

The operation of the voltage comparator will be described in more detail with reference to FIGS. 3, 4a and 4b.

When the driving signal (DMPPU) is a logic low, only the PMOS transistor P1, P3 and P5 are turned on, so that the node NA and the node NB become a power voltage (VDDI) corresponding to the logic high and both the increment signal (INC) and the decrement signal (DEC) become logic low.

If the driving signal (DMPPU) transits from logic low to logic high, the NMOS transistor N5 is turned on and the PMOS transistors P1, P3 and P5 are turned off. At this time, if the phase difference signals (RCKDCC, FCKDCC) are input to the phase comparison/amplification unit 132 as shown in FIG. 4a, the voltage level of the phase difference signal (RCKVO) becomes higher than that of the phase difference signal (FCKVO), so that the NMOS transistor N3 is first turned on. The NMOS transistor N1 is turned on by the node NB of logic high (i.e., an initial state). As described above, if the NMOS transistor N1, N3 and N5 are all turned on, the node NA becomes a ground voltage (VSS) corresponding to logic low. At this time, since the NMOS transistor N4 has been turned off, the node NB maintains a power voltage (VDDI) corresponding to logic high (i.e., an initial state).

If the node NA becomes the ground voltage (VSS) corresponding to logic low and the node NB maintains the power voltage (VDDI) corresponding to logic high as described above, the inverter IV11 inverts the logic low of the node NA and outputs logic high. The NAND gate ND1 performs a NAND operation on the driving signal (DMPPU) of the logic high and the output signal of the logic high of the inverter IV11 and outputs a signal of logic low. The inverter IV13 inverts the output signal of the logic low of the NAND gate ND1 and outputs the increment signal (INC) of logic high.

Meanwhile, the inverter IV12 inverts the logic high of the node NB and outputs logic low. The NAND gate ND2 performs a NAND operation on the driving signal (DMPPU) of the logic high and the output signal of logic low of the inverter IV12 and outputs logic high. The inverter IV14 inverts the logic high and outputs the decrement signal (DEC) of logic low.

The bi-directional counter 134 outputs a value (a detailed value of the count signal will be omitted) of the 5-bit count signal (CNT<0:4>) for extending a pulse width (T1) of the clock signal (RCKDCC) in order to align the pulse width (T1) of the clock (RCKDCC), which is shown in FIG. 4a, with a pulse width (Tref) of the external clock (CK) (i.e., a basis) in response to the increment signal (INC) of logic high.

The digital/analog converter 135 generates the duty cycle correction analog signals (DCCRVREF, DCCFVREF) for aligning the pulse width (T1) of the clock (RCKDCC) with the pulse width (Tref) of the external clock (CK) (i.e., a basis) using the value of the 5-bit count signal (CNT<0:4>) for extending the pulse width (T1) of the clock (RCKDCC).

The clock buffer/mux unit 110 generates the clocks (RCKT1, FCKT1) having the same duty cycle as that of the external clock (CK), i.e., whose duty cycle is corrected using the duty cycle correction analog signals (DCCRVREF, DCCFVREF).

The clock driver unit 120 receives the clocks (RCKT1, FCKT1) having the same duty cycle as the external clock (CK) and generates the clocks (RCKT2, FCKT2) whose duty cycle is corrected.

If the duty cycle is corrected as described above, the operation of the duty cycle correction unit 130 stops.

The DLL block 200 generates the DLL clocks (RCKDLL, FCKDLL) whose duty cycle is accurately 50% using the clocks (RCKT2, FCKT2) whose duty cycle is corrected.

If the clocks (RCKDCC, FCKDCC) are input to the phase comparison/amplification unit 132 with the driving signal (DMPPU) being logic high as shown in FIG. 4b, the voltage level of the phase difference signal (FCKVO) becomes higher than that of the phase difference signal (RCKVO), so that the NMOS transistor N4 of voltage comparator 133 is first turned on.

The NMOS transistor N2 has been turned on by the node NA of logic high (i.e., an initial state). If the NMOS transistors N2, N4 and N5 are all turned on, the node NB becomes the ground voltage (VSS) corresponding to logic low. At this time, since the NMOS transistor N3 has been turned on, the node NA is kept to the power voltage (VDDI) corresponding to the logic high (i.e., an initial state).

If the node NB becomes the ground voltage (VSS) corresponding to logic low and the node NA maintains the power voltage (VDDI) corresponding to logic high as described above, the inverter IV12 inverts the logic low of the node NB and outputs logic high. The NAND gate ND2 performs a NAND operation on the driving signal (DMPPU) of the logic high and the output signal of the logic high of the inverter IV12 and outputs a signal of logic low. The inverter IV14 inverts the logic low and outputs the decrement signal (DEC) of logic high.

Meanwhile, the inverter IV11 inverts the logic high of the node NA and outputs logic low. The NAND gate ND2 performs a NAND operation on the driving signal (DMPPU) of the logic high and the output signal of logic low of the inverter IV11 and outputs logic high. The inverter IV13 inverts the logic high and outputs the increment signal (INC) of logic low.

The bi-directional counter 134 outputs a value (a detailed value of the count signal will be omitted) of the 5-bit count signal (CNT<0:4>) for extending a pulse width (T3) of the clock signal (RCKDCC) in order to align the pulse width (T3) of the clock (RCKDCC), which is shown in FIG. 4b, with a pulse width (Tref) of the external clock (CK) (i.e., a basis) in response to the decrement signal (DEC) of logic high.

The digital/analog converter 135 generates the duty cycle correction analog signals (DCCRVREF, DCCFVREF) for aligning the pulse width (T3) of the clock (RCKDCC) with the pulse width (Tref) of the external clock (CK) (i.e., a basis) using the value of the 5-bit count signal (CNT<0:4>) for extending the pulse width (T3) of the clock (RCKDCC).

The clock buffer/mux unit 110 generates the clocks (RCKT1, FCKT1) having the same duty cycle as that of the external clock (CK), i.e., whose duty cycle is corrected using the duty cycle correction analog signals (DCCRVREF, DCCFVREF).

If the duty cycle is corrected as described above, the operation of the duty cycle correction unit 130 stops.

The clock driver unit 120 receives the clocks (RCKT1, FCKT1) and generates the clocks (RCKT2, FCKT2) whose duty cycle is corrected.

The DLL block 200 generates the DLL clocks (RCKDLL, FCKDLL) whose duty cycle is accurately 50% using the clocks (RCKT2, FCKT2) whose duty cycle is corrected.

Figure 5:
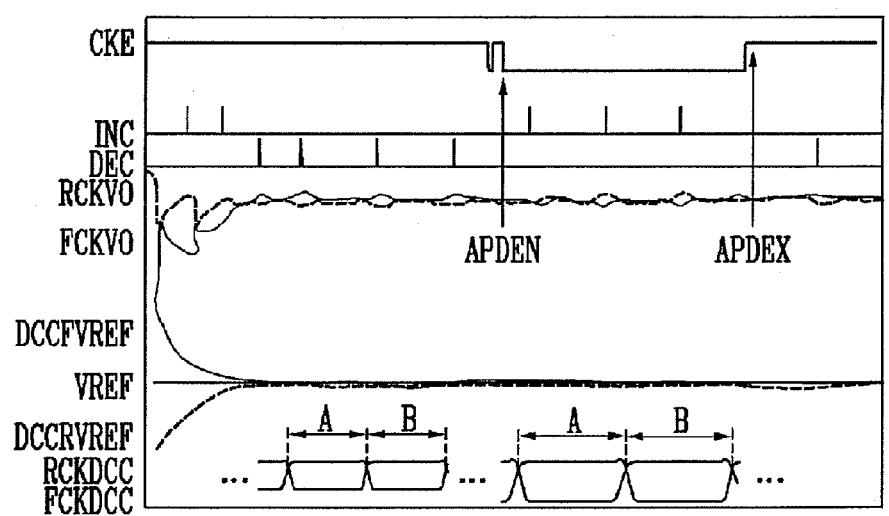
FIG. 5 shows an operating timing diagram of the duty cycle correction circuit shown in FIG. 2.

FIG. 5 shows an operating timing diagram of the duty cycle correction circuit shown in FIG. 2.

From FIG. 5, it can be seen that when the mode becomes the APDM, the voltage comparator 133 shown in FIG. 2 is not reset, and although the internal power supply voltage is instantly changed (i.e., the clock enable signal (CKE) is changed), the duty cycle of the clocks (RCKDCC, FCKDCC) is corrected to 50%.

As described above, as the voltage comparator 133 does not receive the clock enable signal (CKE), the voltage comparator 133 operates without being reset although the mode becomes the APDM.

As a result, as the duty cycle correction circuit 100 and the DLL block 200 operate, the duty cycle of the DLL clocks (RCKDLL, FCKCLL) remains at 50%.

As described above, in accordance with the present invention, although an internal power supply voltage is instantly changed in the APDM, the duty cycle of DLL clocks is continuously set with 50%. It is thus possible to prevent tAC from being significantly changed or tCK from being changed.

As a result, although a DRAM performs a read operation with it being deviated from the APDM, it can normally operate.

Although the foregoing description has been made with reference to the preferred embodiments, it is to be understood that changes and modifications of the present invention may be made by a person having ordinary skill in the art without departing from the spirit and scope of the present invention and appended claims.

What is claimed is:

1. A duty cycle correction circuit of a DLL circuit, comprising:
   a clock buffer unit that buffers an external clock and outputs a buffered clock;
   a phase comparison unit that compares the phase of the buffered clock and generates first and second phase difference signals;
   a voltage comparator that generates an increment signal and a decrement signal that compares the first and second phase difference signals even in an Active Power-Down Mode (APDM);
   a bi-directional counter that outputs a count signal in response to the increment signal or the decrement signal; and
   a digital to analog converter that outputs duty cycle correction analog signals for correcting the duty cycle of the buffered clock by setting the duty cycle of the buffered clock to that of the external clock in response to the count signal.

2. The duty cycle correction circuit as claimed in claim 1, further comprising a comparator controller that generates a driving signal for driving the operation of the voltage comparator using the buffered clock.

3. The duty cycle correction circuit as claimed in claim 1, wherein the phase comparison/amplification unit outputs the first phase difference signal having a voltage level higher than that of the second phase difference signal if a high pulse width of the buffered clock is smaller than that of the low pulse width, and outputs the second phase difference signal having a voltage level higher than that of the first phase difference signal if a high pulse width of the buffered clock is greater than that of the low pulse width.

4. The duty cycle correction circuit as claimed in claim 1, wherein the voltage comparator operates regardless of variation in the level of a clock enable signal, generating the increment signal and the decrement signal.

5. The duty cycle correction circuit as claimed in claim 1, wherein the voltage comparator includes a differential amplifier that compares the first and second phase difference signals, and a digital signal generator that generates the increment signal and the decrement signal using output signals of the differential amplifier.

6. The duty cycle correction circuit as claimed in claim 1, wherein the voltage comparator outputs the increment signal as logic high if the voltage level of the first phase difference signal is higher than that of the second phase difference signal, and outputs the decrement signal as logic high if the voltage level of the first phase difference signal is lower than that of the second phase difference signal.

* * * * *